United States Patent [19]

Antreich et al.

[11] Patent Number: 5,267,176
[45] Date of Patent: Nov. 30, 1993

[54] METHOD FOR PLACING MODULES ON A CARRIER

[75] Inventors: Kurt Antreich; Frank Johannes, both of Germering; Jurgen Kleinhans, Munich; Georg Sigl, Tutzing, all of Fed. Rep. of Germany

[73] Assignee: Siemens Aktiengesellschaft, Munich, Fed. Rep. of Germany

[21] Appl. No.: 684,902
[22] PCT Filed: Oct. 26, 1989
[86] PCT No.: PCT/DE89/00688
§ 371 Date: Apr. 29, 1991
§ 102(e) Date: Apr. 29, 1991
[87] PCT Pub. No.: WO90/05344
PCT Pub. Date: May 17, 1990

[30] Foreign Application Priority Data

Nov. 2, 1988 [EP] European Pat. Off. ........ 88118251.3

[51] Int. Cl.$^5$ .............................................. G06F 15/60
[52] U.S. Cl. .................................. 364/491; 364/490; 364/489; 364/488
[58] Field of Search ................. 364/488, 489, 490, 491

[56] References Cited

U.S. PATENT DOCUMENTS

| | | | |
|---|---|---|---|
| 3,629,843 | 12/1971 | Scheinman | 364/490 |
| 4,342,090 | 7/1982 | Caccoma et al. | 364/491 |
| 4,577,276 | 3/1986 | Dunlop et al. | 364/491 |
| 4,593,363 | 6/1986 | Burstein et al. | 364/491 |
| 4,630,219 | 12/1986 | DiGiacomo et al. | 364/488 |
| 4,852,015 | 7/1989 | Doyle, Jr. | 364/491 |
| 4,908,772 | 3/1990 | Chi | 364/491 |

FOREIGN PATENT DOCUMENTS 0133466 2/1985 European Pat. Off. .

OTHER PUBLICATIONS

"Proud: A Fast Sea-of-Gates Placement Algorithm"; by R. S. Tsay et al.; (25th ACM/IEEE Design Automation Conference) 1988; Paper 22.3; pp. 318-323.

"An Automatic Placer for Arbitrary Sized Rectangular Blocks Based on a Cellular Model"; by D. L. Jarmon, Systems & Applications May 11-15, 1987, IEEE; pp. 466-470.

"An automatic/interactive placement and routing system for custom VLSI layout design"; by H. Cai et al., May 1987 IEEE, Hamburg, pp. 625-628.

"Gordian: A New Global Optimization/Rectangle Dissection Method for Cell Placement", by J. M. Kleinhans et al.; IEEE, 1988; pp. 506-509.

*Primary Examiner*—Vincent N. Trans

[57] ABSTRACT

Method for placing modules on a carrier. Modules, for example cells, are placed on a carrier, for example a chip, with the method. For placement, the modules are arranged such on the placement region of the carrier that the center of gravity of the modules falls onto the center coordinates of the placement region (global placement S1). Subsequently, the placement region is partitioned into sub-regions, modules are allocated to the sub-regions and the area of the sub-regions is defined in the ratio of the area of the modules allocated to these sub-regions (partitioning, S2). In the next step, a global placement is again carried out, i.e. the modules are arranged such in the sub-regions that the modules allocated to the sub-regions have their center of gravity falling onto the center coordinates of these sub-regions. The steps of global placement and of partitioning follow one another until only at most k modules are still present per sub-region. The ultimate position of the modules is then implemented with the assistance of an optimization step (S3), wherein the position for the modules whereat the area exploitation is optimum is calculated taking the position of the modules achieved in the global placement into consideration.

16 Claims, 4 Drawing Sheets

METHOD FOR PLACING MODULES ON A CARRIER

BACKGROUND OF THE INVENTION

The invention is directed to a method for placing modules on a carrier upon employment of a module list containing the dimensions of the modules and of a network list containing the connections of the modules.

Methods for placing modules on a carrier, for example for placing gate arrays, standard cells, macro cells on a chip or for placing modules on printed circuit boards, are known. Let the following be referenced as examples of the prior art: Cheng, C. K., Kuh, E. S., Module Placement based on Resistive Network Optimization, IEEE Transactions on Computer-Aided Design, Vol. CAD-3, 1984, pages 218 through 225; Just, K. M., Kleinhans, J. M., Johannes, F. M., on the Relative Placement and the Transportation Problem for Standard-Cell Layout, Design Automation Conference, 1986, pages 308 through 313. These references recite methods with whose assistance modules are first placed on the carrier in their relative position with respect to one another and are then assigned their ultimate position on the carrier. The point of departure is the topology of the circuit, i.e., for example, a wiring diagram, from which how a plurality of modules are connected to one another derives. The job of the placement is to then optimally arrange these modules on a carrier, for example a chip, taking their connections into consideration. The placement method is described in detail in the said references, these being referenced herein.

The known methods first strive for a relative placement of the modules relative to one another. To that end, the coordinates of the individual modules are calculated such that the center of gravity of the modules is at a prescribed point, for example the center coordinate of the area of the placement surface provided for the arrangement. The coordinates of the modules are calculated by solving an optimization problem, whereby a function of the distances of the modules connected to one another is made into a minimum. The solution of this optimization problem ensues taking secondary conditions into consideration; what is thereby achieved is that the modules lie optimally uniformly distributed on the placement surface. The calculation of the ultimate and overlap-free position of the modules ensues after the end of the relative placement. The information of the relative placement is thereby used.

SUMMARY OF THE INVENTION

The object underlying the invention is comprised in specifying another method for placing prefabricated modules on a carrier.

In a method of the species initially cited, this object is achieved a method for placing modules consisting of moveable modules and fixed modules on a carrier upon employment of a module list containing dimensions of the modules and of a network list containing connections of the modules.

The method has the steps of:

a) arranging all movable modules on the placement region of the carrier by global placement such that the overall center of gravity of the modules lies on an area center of gravity of the placement region and all fixed modules are arranged at edges of the placement region;

b) in a partitioning step, b1) subdividing the placement region into sub-regions, b2) assigning the modules to the sub-regions on the basis of the position of the modules determined in step a), b3) ultimately defining the size of the sub-regions in the ratio of the modules to be arranged in the sub-regions;

c) simultaneously arranging the modules in a global placement for all sub-regions such that their overall center of gravity respectively lies on area centers of gravity of the allocated sub-regions;

d) in a further partitioning step, d1) dividing the sub-regions into further sub-regions, d2) allocating the modules to the further sub-regions on the basis of the position of the modules defined in step c), d3) ultimately defining the size of the further sub-regions in the ratio of the modules to be arranged in the further sub-regions;

continuing the steps c) and d) until at most a prescribable plurality of k modules is allocated to every sub-region.

The method is thus comprised of a repetition of a global placement of the modules on a placement region and of subsequent partitioning, whereby these steps are repeated until every sub-region determined by division contains at most a prescribed number of modules. The global placement ensues by arranging the modules in the sub-regions such that the modules assigned to the sub-regions have their centers of gravity falling onto the center coordinates of these sub-regions. Differing from the known methods, the arrangement of all modules of all sub-regions is thereby simultaneously calculated. The sub-regions are achieved by partitioning the placement region or, respectively, sub-regions, whereby a selectable number of modules are allocated to the sub-regions achieved by the partitioning and the size of the sub-regions achieved by the partitioning is defined dependent on the assigned modules.

The subdivision of the placement region or, respectively, of the sub-regions expediently ensues with horizontal or vertical lines of section. A sorting of the modules from the prior global placement according to their x-coordinates or y-coordinates is then merely required for assigning the modules to the sub-regions. It is expedient when the partitioning is composed of a bipartition of the regions to be divided.

The repetition of global placement and partitioning can be continued until only one module is still arranged in every sub-region. It is more advantageous, however, when this repetition is aborted when a prescribed plurality of modules, for example 8 modules, are at most contained in every sub-region. The ultimate arrangement of the modules can then be implemented with an optimization step given optimum area exploitation on the placement region. This step can be comprised therein that all possible divisions of the sub-regions having up to k modules are identified upon utilization of the result of the global placement and the dimensions of the sub-areas for the placement of a module that are thereby found are combined in a form function. This step can be implemented for all such sub-regions. The dimensions of all permissible module arrangements can be calculated by addition of the form functions of these sub-regions.

More specifically, in the method of the present invention the area centers of gravity of the placement region and of the sub-regions are their respective center coordinates. For the global placement, x, y coordinates of the modules are simultaneously determined according to equations (1) and (2) given below.

Furthermore, in the method of the present invention the fixed modules are displaceable in x-direction or, respectively, y-direction at the edges of the placement region. The allocation of the modules to the sub-regions ensues by sorting the modules according to the x, y-coordinates.

The subdivision of the placement region and of the sub-regions ensues by horizontal and vertical lines of section and modules sub-sets are allocated to the sub-regions achieved by the sectionings. A respective bipartition of every region ensues in the partitioning. Modules whose allocated connections transgress the line of section are allocated to the sub-regions given the additional application of the min-cut principle.

In one embodiment of the method of the present invention the global placement and partitioning is ended when one module is arranged in every sub-region. Also, the optimum area exploitation ensures by identifying all possible divisions of the sub-regions having up to k modules upon utilization of the results of the global placement. The arrangement of the modules in the sub-regions is optimized in that all possible sectionings are identified for every sub-region and the modules are allocated to the sub-areas that have arisen. The dimensions of the smallest rectangular region wherein the modules can be placed overlap-free are calculated for every sectioning and module allocation and the various possible dimensions of a sub-area are combined in a form function. This is implemented for all sub-regions and the dimensions of all allowable module arrangements are calculated by addition of the form functions of all sub-regions. The rotational positions of the modules can be optimized.

The method of the invention has the advantage that modules having different dimensions can be arranged overlap-free in one plane, whereby prescriptions for the locations of a part of the modules are taken into consideration. The method optimizes the arrangement with respect to a function of the distances between given groups of modules and with respect to the overall area of the module arrangement.

The method particularly serves the purpose of implementing the placement of modules (cells, components) in the layout design of electrical circuits, i.e. serves the purpose of converting a given function description of the circuit into a planar, topical arrangement. The dimensions of the modules are thereby specified in a module list. The function description is established as network list wherein all module groups that are to be taken into consideration in the minimization of the module spacings are recited.

The method is suitable both for the layout design of integrated cell circuits in standard cell, macro cell, gate array and sea of gates technology as well as for the placement of modules on printed circuit boards.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGURES in which like reference numerals identify like elements, and in which:

DESCRIPTION OF THE PREFERRED EMBODIMENT

Figure 1:
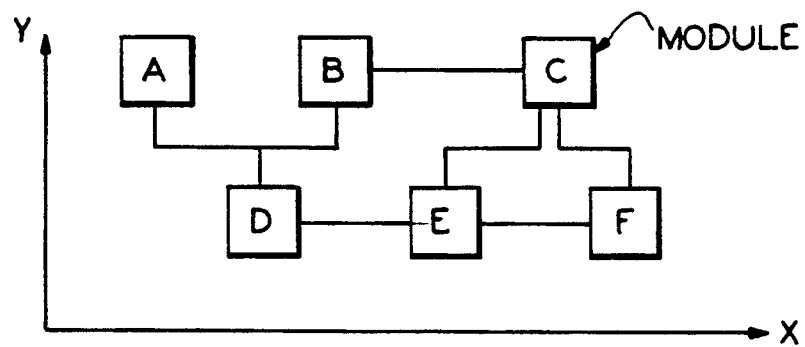
FIG. 1 is a schematic diagram of an example of a wiring diagram having only a few modules.

The problem that is to be resolved with the method can be comprised in converting a wiring diagram as shown, for example, in FIG. 1 into a layout of the circuit, for example on a chip. FIG. 1 merely shows a schematic illustration of a wiring diagram having few modules. The modules are identified with upper case letters. For example, they can represent cells of a cell library. The individual modules are connected to one another, whereby the connections are shown simplified in FIG. 1. The connections of the modules are also referred to as signals.

The dimensions of the modules are contained in a module list and the connections of the modules are contained in a network list. The module list and the network list are prescribed and are employed for placing the modules on a carrier, for example a chip.

Figure 7:
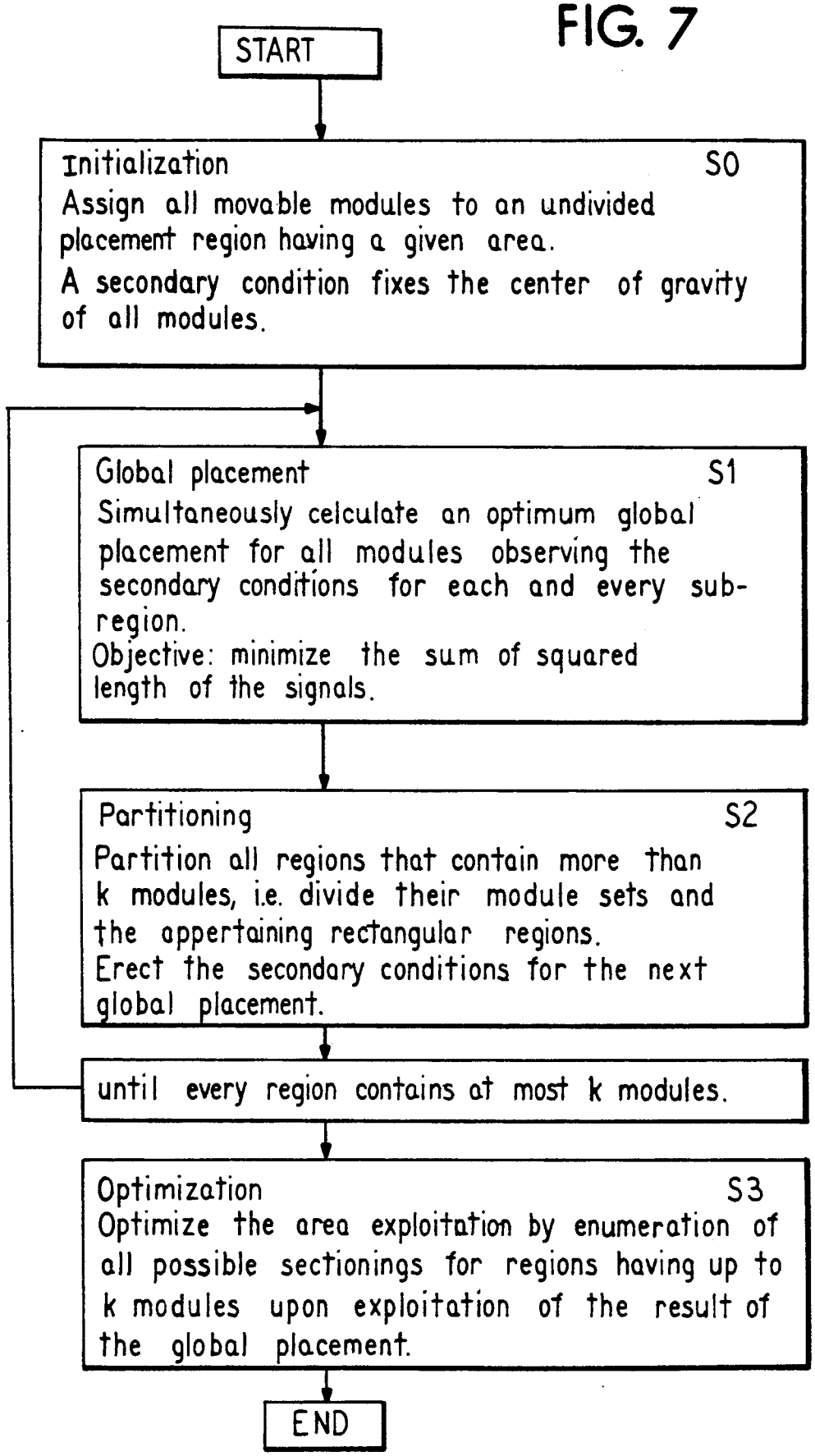
FIG. 7 is a flow chart of the method of the present invention.

The placement of the modules ensues according to the flow chart of FIG. 7. It may be seen that the method is composed of a sequence of alternating steps S0-S3, namely global placements S1 and partitionings S2. The sequence ends when every sub-set of modules that has arisen due to the partitionings contains no more than a prescribable plurality of modules. The method can be expediently ended with an optimization step S3 wherein the area utilization in the sub-regions that have arisen in the placement region is improved by evaluating all possible module arrangements, whereby the rotational position of the modules is also identified in addition to their coordinates.

What is achieved with the global placement is that a globally optimum module arrangement, i.e. optimum topical proximities for all modules, is calculated from the functional circuit description by formulating and solving a continuous optimization problem with secondary conditions. All modules are thereby simultaneously treated until an overlap-free arrangement is achieved.

In the introductory method step S0, all modules $M_b$ are assigned to an undivided set. The network list is thereby given, i.e. the list of all possibly weighted module groups (networks) for which the spacing function is to be minimized. The dimensions and terminal coordinates of all modules M, the geometrical locations of modules having an established positioned (fixed modules) as well as a placement region are also established in the module list. Given secondary conditions must also be observed.

Figure 2:
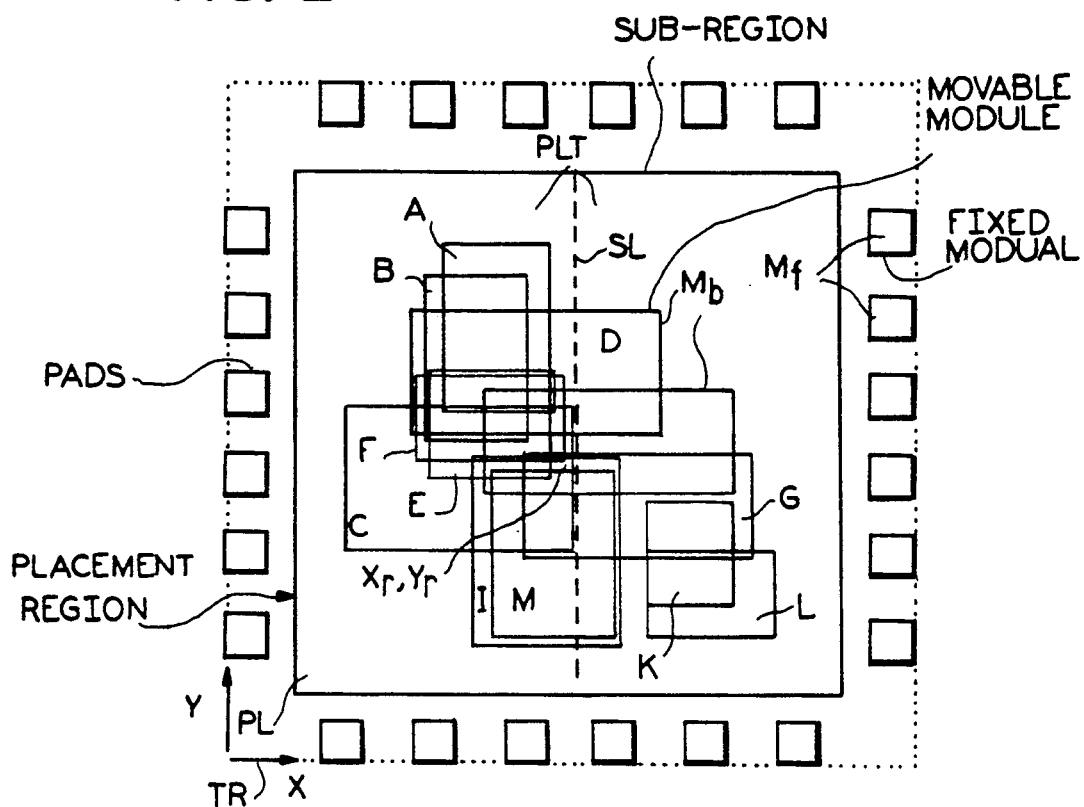
FIG. 2 depicts the arrangement of modules in the placement region in a first pass.

In FIG. 2, the placement region is referenced PL and, for example, can be part of a carrier TR. Modules M are to be arranged on the placement region PL. The modules can be movable or they can have a fixed position. Movable modules are referenced $M_b$ and fixed modules are referenced $M_f$. FIG. 2, for example, represents a chip that comprises terminals (pads) at the edge as fixed modules $M_f$ and comprises movable modules $M_b$ for example cells in the placement region PL. The movable modules $M_b$ are referenced with upper case letters.

The geometrical locations for all modules $M_b$ that are not pre-placed are calculated from the module list and from the network list. This problem is known and, for example, is presented in the references initially recited. The problem is described by the following mathematical model: Calculate the unknown coordinates of the vectors x and y such that $$\phi(x,y) = \tfrac{1}{2} \sum_{n \in N} \sum_{m \in M} ((x_m + u_{nm} - x_n)^2 + (y_m + v_{nm} - y_n)^2) \cdot t_{nm} \cdot w_n \quad (1)$$

becomes a minimum and such that secondary conditions $$\left( \sum_{m \in M_r} F_m \cdot x_m \right) / \left( \sum_{m \in M_r} F_m \right) = X_r \quad (2)$$

and $$\left( \sum_{m \in M_r} F_m \cdot y_m \right) / \left( \sum_{m \in M_r} F_m \right) = Y_r$$

are observed for each of the r placement regions or sub-regions PLT for $1 \leq r \leq R$.

The characters employed in the equations thereby have the following significances:

| | |
|---|---|
| m | module number |
| n | network number |
| M = ( ..., m, ... ) | set of the module numbers |
| N = ( ..., n, ... ) | set of the network numbers |
| $M_b \subset M$ | set of the movable modules |
| $M_f \subset M$ | set of the fixed modules |
| b | number of movable modules |
| f | number of fixed modules |
| x = ( ... $x_n$ ... $x_m$ ... ) | vector of the x-coordinates of all networks and modules |
| y = ( ... $y_n$ ... $y_m$ ... ) | vector of the y-coordinates of all networks and modules |
| $u_{nm}$ | x-coordinate of the terminal of the network n at the module m |
| $v_{nm}$ | y-coordinate of the terminal of the network n at the module m |
| $t_{nm} = 1$ | in case the network n is connected to the module m |
| 0 | in case it is not connected |
| $w_n$ | weighting factor of the network n |
| $F_m$ | surface requirement of the module m |
| r | number of the placement region PL or of a sub-region PLT |
| $M_r \subseteq M_b$ | set of modules onto which the secondary condition r is applied |
| $X_r, Y_r$ | center coordinates of the $r^{th}$ placement region PL, PLT |
| R | number of sub-regions PLT. |

Figure 6:
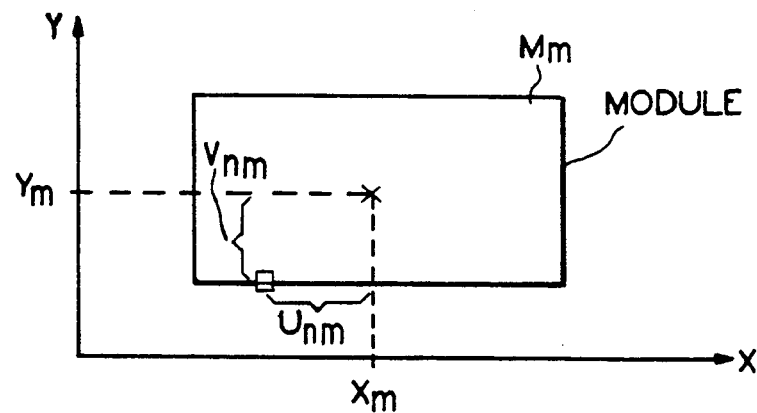
FIG. 6 is a graph showing the X-, Y-coordinates of a module.

The spacings of a module from the connected networks, i.e. $x_m - x_n$, $y_m - y_n$, are also contained in equation 1, whereby $u_{nm}$, $v_{nm}$ also takes into consideration that the networks do not lead to the center of module but to its terminal points. This, for example, can be derived from FIG. 6 wherein a module $M_m$ is shown in the coordinate system. The center of the module is defined by the x-, y-coordinates; the position of the terminal of a module is defined by the coordinates u, v referred to the center of the module. Since the connections lead to the terminals of the modules, the spacing between the center coordinates of the modules must be correspondingly corrected.

The significance of a network can be defined by the weighting factor w. Whether a network is connected to a module or not is recited with the assistance of t.

It can be advantageous for the layout design to not rigidly prescribe the locations of what are referred to as the terminals (pads) at the edge of the placement region PL but to instead allocate them to one of the four edges and to calculate their y-coordinates for left-hand or right-hand terminals and to calculate their x-coordinates for upper and for lower terminals.

The coordinates of the modules are calculated with the assistance of the equation system 1. This system can also be vividly interpreted as a system of mass points that are connected by elastic springs having spring constance. The spring constant thereby corresponds to the significance of the network that is connected to the module under consideration.

The solution of the equation system 1 thus leads to the calculation of the coordinates of all modules $M_b$. Its center of gravity must now be assigned to a defined point of the placement region PL. For this reason, a secondary condition—equation 2—is erected, this specifying the center coordinates $X_r$, $Y_r$ of the placement region PL. When the solution of the equation system 1 ensues taking the secondary condition 2 into consideration, then the center of gravity of the modules is placed onto these center coordinates.

The position of the movable modules $M_b$ within the placement region PL derives from FIG. 2. The modules are arranged around the center coordinates $X_r$, $Y_r$.

More detailed explanations for solving the equation system 1 while taking the secondary condition 2 for a placement region PL into consideration can be derived from the reference of Just (hereby incorporated by reference) cited at the outset. Due to the convexity of the objective function, the problem formulation employed also assures that an unambiguous global optimum exists even given the presence of a plurality of linear secondary conditions 2. The solution can be efficiently acquired with the assistance of known algorithms for processing problems of quadratic optimization such as described, for example, in Gill, P. E., Murray, W., Wright, M. H., Practical Optimization, Academic Press, London, 1981 (hereby incorporated by reference).

According to FIG. 7, the step S1 wherein the modules have been placed on the placement region PL dependent on the equations 1, 2 is followed by the step S2. The placement region PL is now divided (indicated by the line of section SL in FIG. 2). In the partitioning step, thus, the region in which a module can be arranged becomes more and more limited. At the end of the procedure, the sequence of repeated partitioning steps leads to a complete dissection of the placement area into a number of rectangles that corresponds to the number of modules to be placed and, thus, leads to a reliable placement. This differs from the temporary global placements in that the modules are arranged overlap-free and according to the rules of the appertaining design style.

A placement region PL, PLT is described by width, height, area, center coordinates and the set of modules that are to be placed in this region.

When the step S2 is implemented for the first time, one begins with the placement region PL, i.e. the entire placement area, and with the set of all movable modules $M_b$ arranged in this placement region. The partitioning is then composed of two sub-steps: 1. The modules set $M_b$ is divided into sub-sets. The division ensues on the basis of the module coordinates x, y calculated during the global placement step, these coordinates representing a minimum with respect to the network lengths. In a horizontal or, respectively, vertical line of section SL, this is achieved by sorting the modules according to y or, respectively, x coordinates of the modules and by an appropriate division into two or more sub-sets. When the sectioning is to be identified with respect to the number of networks cut by the line of section SL, then an additional application of the min-cut principle onto modules in the proximity of the line of section is also possible. The min-cut principle is disclosed, for example, in Lauther, U., A min-cut placement algorithm for general cell assemblies based on a graph representation, in Design Automation Conference, 1979, pages 1 through 10 (hereby incorporated by reference).

A bipartition by a line of section SL1, namely in vertical direction, ensues in the exemplary embodiment of FIG. 2. In this case, it is expedient to allocate an optimally identical number of modules to each of the sub-regions PLD achieved by the bipartition. In the exemplary embodiment of FIG. 2, the allocation of the modules to the sub-regions PL2 can ensue according to the x-coordinates of the modules, for example the modules having a low x-coordinate can be assigned to the left-hand sub-region and modules having a higher x-coordinate can be assigned to the right-hand sub-region.

2. The placement region PL is divided into non-overlapping sub-regions PLT that completely cover the placement region and in the ratio of the areas of the appertaining module sub-sets. This usually leads thereto that the broken line SL in FIG. 2 is to be shifted. In the case of a horizontal section, the heights $h_{r'}$ and $h_{r''}$ of the sub-regions are selected in the following way:

$$\frac{h_{r'}}{h_{r''}} = \sum_{m' \in M_{r'}} F_{m'} / \sum_{m'' \in M_{r''}} F_{m''} \qquad (3)$$

$F_{m'}$ is thereby the area of a module m' in a sub-region r'; $F_{m''}$ is the area of a module m'' in the other sub-region r''. The sectioning of the placement region PL into sub-regions PLT produced by this partitioning step yields what is referred to as a slicing structure that is a prerequisite for the area optimization to be set forth later and that is especially well-suited for the later design of the connecting networks in the layout design.

Figure 3:
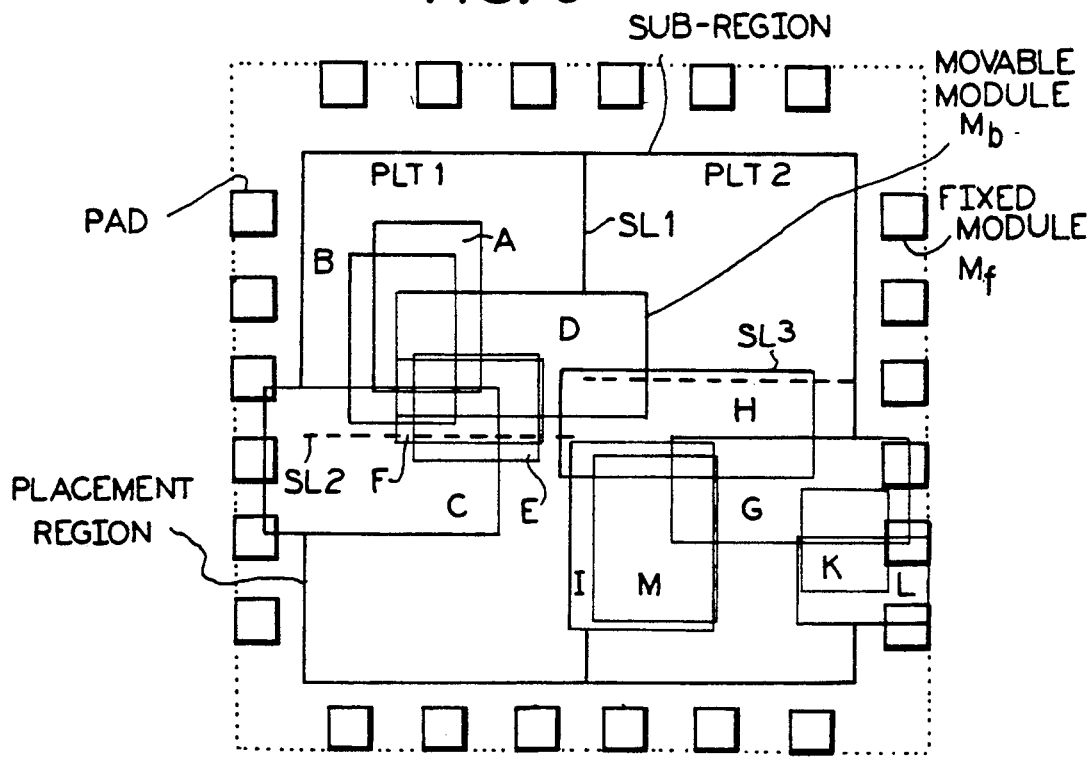
FIG. 3 depicts the placement region with the arrangement of the modules in a second pass.

The global placement step S1 is executed again after the implementation of the step S2. I.E., the equation system 1 is re-calculated but now taking new secondary conditions into consideration, namely secondary conditions for every sub-region PLT. This means that the center coordinates $X_r$ and $Y_r$ are now referred to the sub-regions PLT achieved by the sectioning of the placement region. This would be two sub-regions in the exemplary embodiment, so that two secondary conditions are now to be observed when calculating the equation system 1. The calculation of the equation system 1 ensues simultaneously for all modules and is not separately implemented for every sub-region PLT. FIG. 3 shows the result of step S1, global placement. It may be seen that one part of the modules are now assigned to the left-hand sub-region PLT 1 and one part are assigned to the right-hand sub-region PLT 2. The allocated modules are grouped around the center coordinates within each of the sub-regions PLT. How the individual modules have shifted in terms of their center of gravity from the starting point of FIG. 2 into the sub-regions PLT may be seen with reference to the letters of the modules.

The global placements that S1 is again followed by a partitioning step S2 according to the rules that were set forth above. To that end, every sub-region PLT 1, PLT 2 is respectively subdivided by a line of section SL2, SL3 and the individual modules are assigned to the newly acquired sub-regions dependent on the coordinates acquired during the global placement. The size of the areas of the sub-regions is again determined in the ratio of the areas of the modules assigned to these sub-regions.

Figure 4:
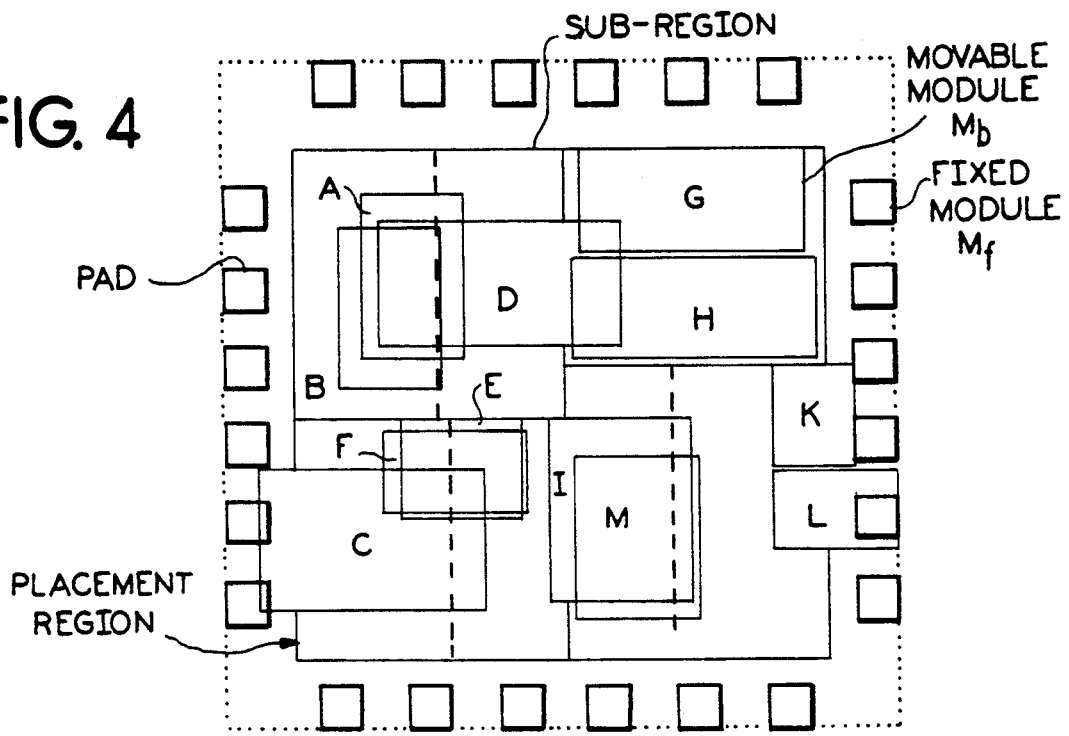
FIG. 4 depicts the placement region with the arrangement of the modules after a third pass.

Step S2 is again followed by the global placement step S1, i.e. the equation system 1 is now solved taking the new secondary conditions into consideration. Given a respective bipartition of the previous sub-regions, four secondary conditions are now to be observed. FIG. 4 shows the result of this calculation. A partitioning, step S2, again ensues following the global placement.

The steps of global placement S1 and partitioning S2 are repeated until either at most one module remains for every sub-region or, on the other hand, until at most k modules are provided per sub-region. For example, k can be 8. In the latter case, it is necessary to implement the ultimate arrangement of the modules in a step S3 that strives for an optimum area exploitation.

Figure 5:
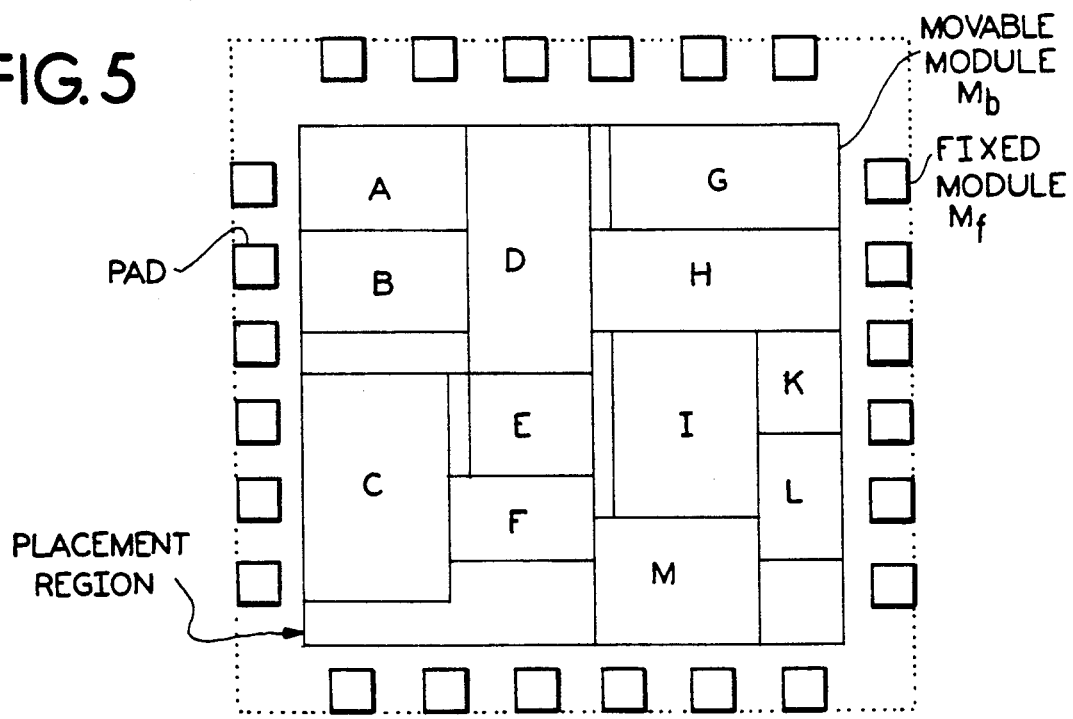
FIG. 5 depicts the ultimate placement of the modules on the placement region.

In the exemplary embodiment of FIGS. 2 through 5, the sequence of global placements and partitions can be aborted, for example, with the step that led to FIG. 4 and the ultimate position of the modules that derives from FIG. 5 can be calculated in the step S3.

A dissection of the given placement region is present at the beginning of the optimization step S3 such that at most the prescribed plurality k of modules is allocated to each sub-region. In the optimization step, the area exploitation of the slicing structure that is achieved is improved both locally as well as globally.

For the local optimization of each and every sub-region PLT having at most k modules, all possible sectionings of this sub-region are identified and the modules are assigned to the sub-areas that have arisen. The results of the global placement are taken into consideration in this optimization, so that the outlay for the optimization is reduced. The dimensions of the smallest rectangular region in which the modules can be placed overlap-free are calculated for every sectioning and module allocation by traversing the slicing structure. The various possible dimensions of the sub-region just processed are combined in a form function. A method in accord wherewith the traversing of the slicing structure and the calculation of the form functions are implemented is known from La Potin, D. P., Director, S. W., Mason: A Global Floor Planning Approach for VLSI Design, IEEE Transactions on Computer-Aided Design, Vol. CAD-5, 1986, pages 477 through 489 (hereby incorporated by reference).

Following the local area optimization, the dimensions of all allowable module arrangements are globally calculated on the basis of a suitable addition of the form functions of all sub-regions. The user thus has the possibility of selecting that arrangement from the alternatives offered that is optimum for his purposes.

The principle of partitioning is inherently known; however, it is usually employed for the purpose of reducing the size of the problem. In the method of the invention, however, it serves the purpose of increasingly limiting the regions wherein a module can be arranged. By making the partitioning progressively finer, an overlap-free arrangement of all modules is achieved at the end of the procedure. The method is thereby of such a nature that all modules are simultaneously handled until the overlap-free arrangement is achieved.

Better results are achieved by the multiple repetition of the method steps of global placement and of partitioning and by the simultaneous working than are achieved by the isolated application of both principles.

An optimum area exploitation is achieved with the assistance of the optimization step, whereby the discrete modules can also be turned in terms of their position relative to one anther.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. Method for placing modules consisting of moveable modules and fixed modules on a carrier using a computer, a module list containing dimensions of the modules and a network list containing connections of the modules, comprising the steps of:
   a) arranging all movable modules on the placement region of the carrier by global placement such that the overall center of gravity of the modules lies on an area center of gravity of the placement region and all fixed modules are arranged at edges of the placement region;
   b) in a partitioning step,
   b1) subdividing the placement region into sub-regions,
   b2) dividing the modules into subsets and assigning the subsets to the sub-regions on the basis of the position of the modules determined in step a),
   b3) ultimately defining the size of the sub-regions by the ratio of subsets of the modules assigned to the sub-regions;
   c) simultaneously arranging the modules in a global placement for all sub-regions given mutual influencing that extends beyond the sub-regions and taking into consideration connections contained in the network list, such that overall centers of gravity of the subsets of the modules respectively lie on area centers of gravity of the sub-regions;
   d) in a further partitioning step,
   d1) dividing the sub-regions into further sub-regions,
   d2) assigning the modules to the further sub-regions on the basis of the position of the modules defined in step c),
   d3) ultimately defining the size of the further sub-regions by the ratio of the modules assigned to in the further sub-regions;
   e) continuing the steps c) and d) until at most a predetermined plurality of k modules is assigned to every sub-region.

2. Method according to claim 1, wherein the area centers of gravity of the placement region and of the sub-regions are their respective center coordinates.

3. Method according to claim 1, wherein the global placement and partitioning is ended when one module is arranged in every sub-region.

4. Method according to claim 1, wherein the optimum area exploitation ensues by identifying all possible divisions of the sub-regions having up to k modules upon utilization of the results of the global placement.

5. Method according to claim 4, wherein the arrangement of the modules in the sub-regions is optimized in that all possible sectionings are identified for every sub-region and the modules are allocated to the sub-areas that have arisen; wherein the dimensions of the smallest rectangular region wherein the modules can be placed overlap-free are calculated for every sectioning and module allocation and the various possible dimensions of a sub-area are combined in a form function; and wherein this is implemented for all sub-regions and the dimensions of all allowable module arrangements are calculated by addition of the form functions of all sub-regions.

6. Method according to claim 5, wherein the rotational positions of the modules are optimized.

7. Method for placing modules consisting of moveable modules and fixed modules on a carrier upon employment of a module list containing dimensions of the modules and of a network list containing connections of the modules, comprising the steps of:
   a) arranging all movable modules on the placement region of the carrier by global placement such that the overall center of gravity of the modules lies on an area center of gravity of the placement region and all fixed modules are arranged at edges of the placement region;
   b) in a partitioning step,
   b1) subdividing the placement region is subdivided into sub-regions,
   b2) assigning the modules to the sub-regions on the basis of the position of the modules determined in step a),
   b3) ultimately defining the size of the sub-regions in the ratio of the modules to be arranged in the sub-regions;
   c) simultaneously arranging the modules in a global placement for all sub-regions such that their overall center of gravity respectively lies on area centers of gravity of the allocated sub-regions, the area centers of gravity of the placement region and of the sub-regions being their respective center coordinates and, for the global placement, x, y coordinates of the modules being simultaneously determined such that $$\phi(x,y) = \tfrac{1}{2} \sum_{n \in N} \sum_{m \in M} ((x_m + u_{nm} - x_n)^2 + (y_m + v_{nm} - y_n)^2) \cdot t_{nm} \cdot w_n$$

becomes a minimum and such that secondary conditions $$\left( \sum_{m \in M_r} F_m \cdot x_m \right) / \left( \sum_{m \in M_r} F_m \right) = X_r$$

-continued and $$\left(\sum_{m\epsilon M_r} F_m \cdot y_m\right) / \left(\sum_{m\epsilon M_r} F_m\right) = Y_r$$

for $1 \leq r \leq R$ are observed for the placement region or, respectively, for every sub-region, whereby the characters employed in the equations have the following significances:

| | |
|---|---|
| m | module number |
| n | network number |
| $M = (\ldots, m, \ldots)$ | set of the module numbers |
| $N = (\ldots, n, \ldots)$ | set of the network numbers |
| $M_b \subset M$ | set of the movable modules |
| $M_f \subset M$ | set of the fixed modules |
| b | number of movable modules |
| f | number of fixed modules |
| $x = (\ldots x_n \ldots x_m \ldots)$ | vector of the x-coordinates of all networks and modules |
| $y = (\ldots y_n \ldots y_m \ldots)$ | vector of the y-coordinates of all networks and modules |
| $u_{nm}$ | x-coordinate of the terminal of the network n at the module m |
| $v_{nm}$ | y-coordinate of the terminal of the network n at the module m |
| $t_{nm} = 1$ | in case the network n is connected to the module m |
| 0 | in case it is not connected |
| $w_n$ | weighting factor of the network n |
| $F_m$ | surface requirement of the module m |
| r | number of the placement region PL or of a sub-region PLT |
| $M_r \subset M_b$ | set of modules onto which the secondary condition r is applied |
| $X_r, Y_r$ | center coordinates of the $r^{th}$ placement region PL, PLT |
| R | number of sub-regions PLT[.] | d) in a further partitioning step,
d1) dividing the sub-regions into further sub-regions,
d2) allocating the modules to the further sub-regions on the basis of the position of the modules defined in step c),
d3) ultimately defining the size of the further sub-regions in the ratio of the modules to be arranged in the further sub-regions;
e) continuing the steps c) and d) until at most a prescribable plurality of k modules is allocated to every sub-region.

8. Method according to claim 7, wherein the fixed modules are displaceable in x-direction or, respectively, y-direction at the edges of the placement region.

9. Method according to claim 8, wherein the allocation of the modules to the sub-regions ensues by sorting the modules according to the x, y-coordinates.

10. Method according to claim 9, wherein the subdivision of the placement region and of the sub-regions ensues by horizontal and vertical lines of section and modules sub-sets are allocated to the sub-regions achieved by the sectionings.

11. Method according to claim 10, wherein a respective bipartition of every region ensues in the partitioning.

12. Method according to claim 11, wherein modules whose allocated connections transgress the line of section are allocated to the sub-regions given the additional application of the min-cut principle.

13. Method according to claim 7, wherein the global placement and partitioning is ended when one module is arranged in every sub-region.

14. Method according to claim 7, wherein the optimum area exploitation ensues by identifying all possible divisions of the sub-regions having up to k modules upon utilization of the results of the global placement.

15. Method according to claim 14, wherein the arrangement of the modules in the sub-regions is optimized in that all possible sectionings are identified for every sub-region and the modules are allocated to the sub-areas that have arisen; wherein the dimensions of the smallest rectangular region wherein the modules can be placed overlap-free are calculated for every sectioning and module allocation and the various possible dimensions of a sub-area are combined in a form function; and wherein this is implemented for all sub-regions and the dimensions of all allowable module arrangements are calculated by addition of the form functions of all sub-regions.

16. Method according to claim 15, wherein the rotational positions of the modules are optimized.

* * * * *